Figure 1A:
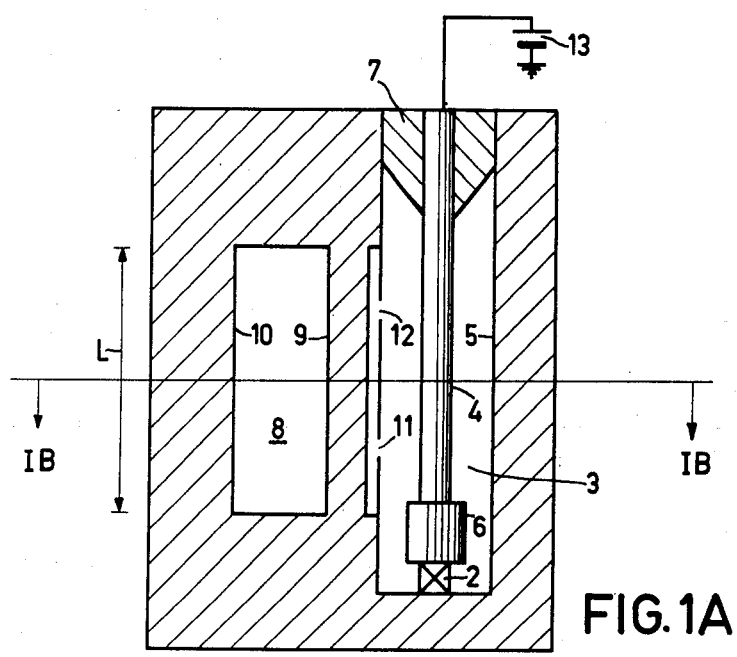

United States Patent [19]

Tjassens

[11] 4,283,689
[45] Aug. 11, 1981

[54] MICROWAVE OSCILLATOR CIRCUIT WITH IMPROVED EFFICIENCY

[75] Inventor: Hindrik Tjassens, Eindhoven, Netherlands

[73] Assignee: U.S. Philips Corporation, New York, N.Y.

[21] Appl. No.: 39,717

[22] Filed: May 17, 1979

[30] Foreign Application Priority Data

Jun. 20, 1978 [NL] Netherlands .......................... 7806617

[51] Int. Cl.³ .............................................. B41J 27/00
[52] U.S. Cl. ................................. 331/101; 331/107 R
[58] Field of Search .............. 331/107 R, 96, 107 DP, 331/107 G, 107 C, 56, 107 T, 101

[56] References Cited

U.S. PATENT DOCUMENTS

| | | | |
|---|---|---|---|
| 3,534,293 | 10/1970 | Harkless | 331/96 |
| 4,034,314 | 7/1977 | Dydyk | 331/101 |
| 4,162,458 | 7/1979 | Dydyk et al. | 331/101 |

Primary Examiner—David K. Moore
Attorney, Agent, or Firm—Thomas A. Briody; David R. Treacy; Robert J. Kraus

[57] ABSTRACT

A microwave oscillator circuit, suitable for use as the local oscillator in beam transmitters, radar systems and satellite TV receivers, comprises an active element (IMPATT, Gunn diode) at one end of a coaxial transmission line which is terminated at its other end by a matched load. At a suitable distance from the diode a high Q transmission cavity resonator is coupled to the transmission line via a first coupling hole.

A drawback of such a circuit is that a portion of the oscillator power at the required oscillator frequency $f_o$ is dissipated in the terminal impedance $Z_o$.

This is obviated by coupling the transmission resonant cavity to the transmission line via a second coupling hole (12, FIG. 1 and FIG. 2). The distance between the first and the second coupling hole is $\frac{1}{4}\lambda$.

As a result the terminal impedance, which has been transformed very frequency-selective to a very high value in situ of the second coupling hole, is transformed to a very low value at the first coupling hole and very little power is dissipated in this low impedance, so that a considerable improvement of the circuit efficiency has been achieved.

6 Claims, 4 Drawing Figures

MICROWAVE OSCILLATOR CIRCUIT WITH IMPROVED EFFICIENCY

The invention relates to a microwave oscillator circuit comprising a transmission line having two ends, a first end being coupled to a diode having a negative resistance for generating oscillations at a frequency $f_o$, and the second end being terminated by a terminal impedance which corresponds to the characteristic impedance of the transmission line. The invention further commprises a cavity resonator having a resonant frequency $f_o$ being coupled to the transmission line at a point defined by a first coupling hole, situated between the diode and the terminal impedance.

Such an oscillator is disclosed in U.S. Pat. No. 3,534,293. The circuit therein described comprises a diode having a negative resistance, such as, for example, an IMPATT or a Gunn-effect diode, coupled to the first end of the transmission line. The second end of this transmission line is terminated in a reflectionless characteristic impedance $Z_o$. At a suitable distance from the diode, for example $\frac{1}{4}\lambda + \eta\lambda/2$ with $\eta = 1$ of the oscillator frequency $f_o$, the transmission line is coupled to a cavity resonator having a resonant frequency $f_o$ and a high quality factor Q. The high quality factor Q exercises a stabilizing influence on the oscillator frequency $f_o$, while for frequencies other than the resonant frequency, the diode is loaded in a wide-band manner by the terminal impedance $Z_o$, so that unwanted oscillations are inhibited.

A drawback of such a circuit is that a not inconsiderable part of the oscillator power is dissipated in the terminal impedance $Z_o$. The circuit efficiency, the ratio between the useful output power and the power supplied by the diode is, consequently, comparatively low.

To alleviate this drawback it is known from U.S. Pat. No. 4,034,314 to couple a second resonant cavity, also having a resonant frequency $f_o$, to a coaxial transmission line. This second cavity resonator is arranged at a point between the first cavity resonator and the terminal impedance $Z_o$ at a distance of $\lambda/4$ (at the resonant frequency $f_o$) from the first cavity resonator. At the resonant frequency the second cavity resonator forms at its coupling hole to the transmission line a very high impedance in series with the terminal impedance $Z_o$. At the coupling hole of the first cavity resonator this high impdance is transformed, in a very frequency-selective manner by the quarter wave transmission line, into a very low impedance so that very little power of the oscillator is dissipated in the terminal impedance at frequency $f_o$ and the circuit efficiency is increased.

This prior solution has the drawback that the transformation is only effective if the resonant frequencies of the two cavity resonators are accurately matched, so that high requirements must be imposed on the mechanical tolerances. In addition, the oscillator circuit becomes bulky because of the addition of an extra resonant cavity. Furthermore, the tuning of the two cavity resonators must be altered in an accurately identical manner in order to change the oscillating frequency.

Another known way to increase the circuit efficiency of circuits of the type defined in the preamble is known from: P. W. Dorman, A single-tuned oscillator circuit for Gunn diode characteristics, IEEE Transactions on MTT, October 1972, pages 701–702. Dorman proposes to decrease the effective terminal impedance $Z_o$, around the oscillator frequency $f_o$, by means of $\lambda/4$ choke in the coaxial transmission line. The $\lambda/4$ choke is provided between the coupling hole and the terminal impedance $Z_o$. The effective terminal impedance is decreased, in a frequency selective manner at the coupling hole, so that less of the oscillator power at frequency $f_o$ is dissipated in the terminal impedance. This increases the circuit efficiency.

The diode used, such as a Gunn-effect diode or an IMPATT diode or other suitable diodes, has a negative impedance over a rather wide frequency range so that oscillations at various frequencies in that range are possible. To avoid oscillations at a frequency other than the desired frequency, the choke must consequently be narrow-band. In addition, the resonant frequency of the choke must be substantially accurately the same value as the resonant frequency of the cavity resonator. However, this imposes high requirements on the mechanical precision.

A further way for improving the circuit efficiency of the type defined in the preamble is known from R. Knöchel & K. Schünemann, Improved cavity-stabilised oscillator circuit for single mode operation. Electronics Letters No. 19, September 1977, pages 583–585. In this article it is proposed to decrease the effective terminal impedance in a frequency-selective manner by incorporating a $\lambda/4$ transformer in the coaxial transmission line between the terminal impedance $Z_o$ and the coupling hole of the cavity resonator. At the coupling hole, the terminal impedance is transformed to a lower value, which increases the circuit efficiency.

This solution has the drawback that the $\lambda/4$ transformer decreases the effective terminal impedance over a relatively wide frequency range so that unwanted oscillations can be easily generated because Gunn-effect diodes as well as IMPATT diodes likewise have a negative impedance over a wide frequency range.

It is an object of the invention to provide a microwave oscillator circuit of the type defined in the preamble wherein a frequency-selective effective reduction of the terminal impedance is realised in a simple manner and wherein the above-mentioned drawbacks are alleviated.

In accordance with the forgoing object, the present invention provides a microwave oscillator circuit characterized in that the cavity resonator is further coupled to the transmission line at a point defined by a separate coupling hole, this second coupling hole being situated at a distance equal to an odd number of quarter wavelengths, at the resonant frequency $f_o$, from the first coupling hole into the direction of the terminal impedance.

In accordance with the invention the transformed terminal impedance $Z_o$ at the first coupling hole is reduced in a very frequency-selective manner at the resonant frequency $f_o$ of the resonant cavity. As a consequence thereof considerably less power is dissipated in the terminal impedance. This increases the circuit efficiency.

The means for coupling out microwave power from the resonant cavity can be a probe. The effective quality factor of the resonant cavity is determined by the value of the power to be supplied: a higher loading of the resonant cavity results in a lower effective quality factor ("loaded Q"). A higher loading of the resonant cavity also causes the frequency stability to decrease. The advantage of an improved efficiency of the oscillator circuit according to the invention also implies that the loading of the resonant cavity can be decreased for the same value of the supplied power. This increases the frequency stability.

The very frequency selective reduction of the terminal impedance has the additional advantage that unwanted oscillations, which might be produced as the diodes used often have a negative impedance over a wide frequency spectrum, are markedly inhibited.

The oscillator frequency can be altered by altering the tuning of the resonant cavity in a known manner. An advantage of the measure according to the invention is that the oscillator frequency and the frequency at which the terminal impedance is reduced are altered simultaneously by the same amount, thus enabling simple tuning.

The invention has the additional advantage that it has a relatively simple construction and requires little space, so that a compact and inexpensive microwave oscillator circuit is ensured.

The resonant cavity utilized in an oscillator circuit according to the invention may have any form which is suitable for that purpose. A particularly attractive implementation of an oscillator circuit according to the invention is characterized in that the resonant cavity and the transmission line are coaxial and that the inner conductor of the resonant cavity and the outer conductor of the transmission line share a common wall over a distance of approximately an integral number of half wavelengths of the resonant frequency $f_o$.

In addition to the advantages already mentioned this embodiment of the invention has the advantage, from the constructional point of view, that the two coupling holes can be provided in a simple manner.

The oscillator circuit can be used as a local oscillator in beam transmitters, radar equipment and satellite TV reception and as an amplifier.

Figure 1B:
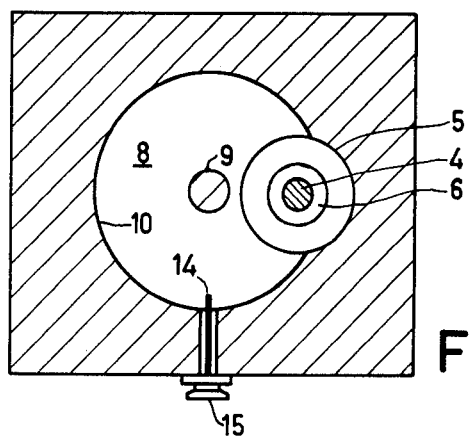
Figure 2A:
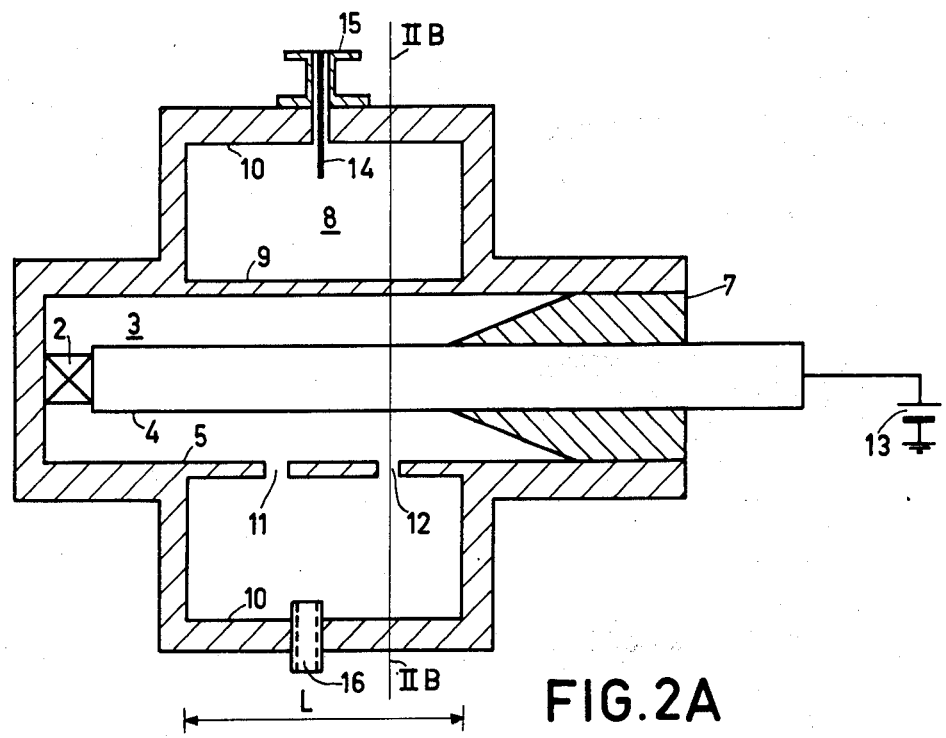
Figure 2B:
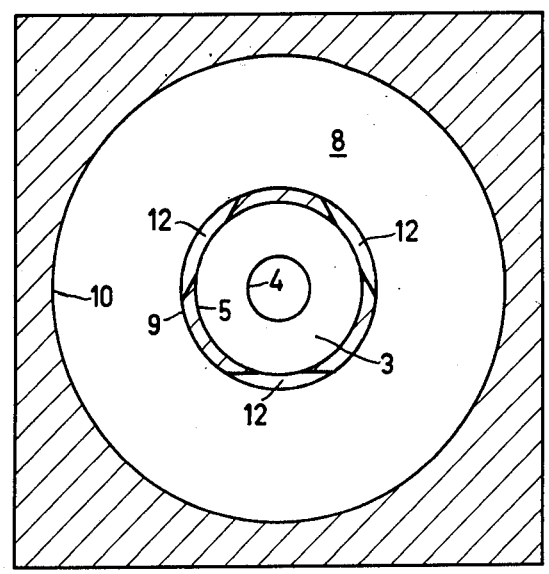

The invention and its advantages will be further explained with reference to the Figures, wherein the same or corresponding components have been given the same reference numerals, and in which:

FIG. 1A shows a cross-section of a schematically shown first embodiment of a microwave oscillator circuit according to the invention, FIG. 1B shows a cross-section along the line IB—IB of FIG. 1A, FIG. 2A shows a cross-section of a schematically shown second embodiment of a microwave oscillator circuit according to the invention, FIG. 2B shows a cross-section along the line IIB—IIB of FIG. 2A.

In the first embodiment of an oscillator circuit of FIG. 1 a diode 2 is provided at one of the two ends of a coaxial transmission line 3, which consists of an inner conductor 4 and an outer conductor 5. A transformer 6 is provided between diode 2 and the inner conductor 4. The transformer 6 is formed by a coaxial line having a length of a quarter wavelength at the oscillator frequency $f_o$ and has a characteristic impedance Z.

The other end of the coaxial transmission line 3 is terminated by a terminal impedance 7. The terminal impedance 7 has a value—$Z_o$—which corresponds to the characteristic impedance $Z_o$ of the coaxial transmission line 3.

A coaxial resonant cavity 8 consisting of an inner conductor 9 and an outer conductor 10 is coupled to the coaxial transmission line 3 via a first coupling hole 11 and a second coupling hole 12 formed in the outer conductor 5 of the transmission line 5. The second coupling hole 12 is situated between the first coupling hole 11 and the terminal impedance 7 and is at a distance of an odd integral number of times a quarter wavelength of the oscillator frequency $f_o$ from the first coupling hole 11. The length L of the resonant cavity 8 is an integral number of times half a wavelength of the oscillator frequency $f_o$.

The distance between the diode 2 and the first coupling hole 11 and the transformer 6 determine the load impedance presented to diode 2. If diode 2 is, for example, an IMPATT diode this load resistance should have a value in the range from 2–5 Ohm whereas a value of 5–10 Ohm is optimal for a Gunn diode.

The supply source 13 is d.c. coupled to diode 2 via the inner conductor 4. The output signal of the oscillator circuit 13 is taken from output 15 through a probe 14.

The oscillator circuit operates as follows. The power at frequency $f_o$, supplied by diode 2 is coupled for the major part through the first coupling hole 11 into the resonant cavity 8 from which the power can be taken out via probe 14 and output 15. A very small part of the power at frequency $f_o$ is reflected by the first coupling hole 11 back to diode 2, and the remaining part is dissipated in the terminal impedance 7 of the coaxial transmission line 3. Now the power at frequency $f_o$ which is dissipated in the terminal impedance 7 should be as small as possible.

It is an object of the invention to increase the circuit efficiency by decreasing the power at frequency $f_o$ which is dissipated by the terminal impedance 7. To that end the oscillator circuit is provided with a second coupling hole 12. At each of the coupling holes 11 and 12 the resonant cavity 8 presents at the oscillator frequency $f_o$ a high impedance in series with the coaxial transmission line 3. Hence, at the second coupling hole 12, there is a high impedance in series with the terminal impedance 7 at the oscillator frequency $f_o$. At the first coupling hole 11 this high impedance is transformed, owing to the particular distance between the two coupling holes, to a very low impedance in series with the high impedance presented by the resonant cavity at the coupling hole 11 at the resonant frequency $f_o$. Therefore the distance between the coupling holes must be equal to an odd integral number of times a quarter wavelength. Thus, at the frequency $f_o$, very little power is dissipated in the terminal impedance 7 which is transformed in a very frequency-selective manner to a low value at the first coupling hole 11. As a result the circuit efficiency, i.e. the ratio of the useful output power to the imput power supplied by the diode, is considerably increased.

The power supplied by the oscillator is determined by the degree of coupling between the probe 14 and the resonant cavity 8. A higher loading of the resonant cavity 8 results in that the so-called "loaded Q", the effective quality factor, being reduced, as a result of which the frequency stability also decreases. However, because the circuit efficiency has been considerably increased, a lower degree of coupling between the probe 14 and the resonant cavity 8 is sufficient for the same value of the supplied power, and hence the frequency stability of the oscillator circuit according to the invention.

The diodes which are used are frequently of the Gunn or IMPATT type. However, these diodes have a negative impedance over a wide frequency range. An advantage of the oscillator circuit according to the invention is that a very frequency-selective decrease of the terminal impedance 7 at frequency $f_o$ is effected, so that oscillations at frequencies other than the desired frequencies (for example owing to "jumping") can be avoided.

A further advantage of the oscillator circuit according to the invention is that very modest requirements can be imposed on the constructional accuracy. In addition, the measure according to the invention requires little space, so that a compact and cheap implementation of the microwave oscillator circuit can be realized.

The particular shape of the resonant cavity shown in FIGS. 1A and 1B is not essential for the invention. Other types of resonant cavity can be used.

FIGS. 2A and 2B show a second embodiment of an oscillator circuit according to the invention. Therein the resonant cavity 8 and the transmission line 3 are arranged coaxially and concentrically. The outer conductor 5 of the coaxial transmission line 3 forms a common wall with the inner conductor 9 of the resonant cavity 8 over a length L. Around the circumference of this common wall the first coupling hole 11 is provided in a first plane perpendicularly to the axis of the coaxial transmission line 3 and the second coupling hole 12 is provided in a second plane parallel to the first plane and at a distance therefrom of an odd number of quarter wavelengths. In the embodiment described here the first and the second coupling holes consist each of three recesses provided in the common wall. The recesses are spaced around the circumference at angular intervals of approximately 120°. The coupling holes 11 and 12 are in no way limited to the construction described here but may have any other suitable shape, as is obvious to one skilled in the art.

A further advantage of this embodiment of the oscillator circuit is that a construction is obtained wherein the coupling holes in the coaxial transmission line 3 can be realized in a very simple manner, for example by means of saw cuts. In addition, the regular spacing at the recesses ensures that the excitation of unwanted modes is inhibited.

The oscillator circuit may be provided with known tuning means. These means are not shown in FIG. 1, and in FIG. 2 the tuning means are formed by a tuning screw 16. The oscillator frequency of the circuit can be altered by means of the tuning means. The measure according to the invention has the further advantage that when the oscillator circuit is detuned, so that the oscillator frequency changes, the frequency at which the terminal impedance is reduced changes likewise, because the resonant frequency of the cavity resonator is the determining factor for both effects.

What is claimed is:

1. A microwave oscillator circuit comprising a transmission line having an inner conductor and an outer conductor, said inner and outer conductor being terminated at one end by a diode having a negative resistance for generating oscillations at a frequency $f_o$ and at the other end by a terminal impedance which corresponds to the characteristic impedance of the transmission line, a cavity resonator coupled to said transmission line between said diode and said terminal impedance, said cavity resonator having an inner wall at least partially common with said outer conductor, said inner wall including a first impedance coupling between said transmission line and said cavity resonator and a second impedance coupling between said transmission line and said cavity resonator, said first and second impedance coupling being spaced from one another by an odd number of quarter wavelengths at said frequency toward said terminal impedance.

2. The microwave circuit of claim 1 wherein said cavity resonator inner wall is curved and coaxial with said transmission line, and wherein said first and second impedances each comprise a plurality of recesses spaced at angular intervals on said wall in a direction transverse to the axial direction of said transmission line.

3. A microwave oscillator circuit comprising a transmission line having two ends, a first end being coupled to a negative resistance device for generating oscillations at a frequency $f_o$, and the second end being terminated by a terminal impedance which corresponds to the characteristic impedance of the transmission line, and further comprising a cavity resonator having a resonant frequency $f_o$ being coupled to the transmission line between said device and said terminal impedance, said resonator being coupled to said transmission line at a first point situated between said device and said terminal impedance, wherein the improvement comprises means further coupling said cavity resonator to said transmission line at a separate second point, said second point being situated at a distance of an odd number of quarter wavelengths at the resonant frequency $f_o$ from said first point towards said terminal impedance.

4. The circuit of claim 3 wherein said cavity resonator is coupled to said transmission line along a common wall, and wherein said first and second coupling points are each respective open passages, formed in said wall, between said transmission line and said cavity resonator.

5. A microwave oscillator circuit as claimed in claim 3, wherein said cavity resonator and said transmission line are coaxial, the inner conductor of said cavity resonator and the outer conductor of said transmission line sharing a common wall over a distance of approximately an integral number of half wavelengths at the resonant frequency $f_o$ of the cavity resonator.

6. The circuit of claim 3 wherein said cavity resonator is coupled to said transmission line along a common curved wall coaxial with said transmission line, and wherein said first and second coupling points each comprise a plurality of recesses spaced at angular intervals on said wall.

* * * * *